United States Patent
Mitchell et al.

(10) Patent No.: US 6,903,613 B1
(45) Date of Patent: Jun. 7, 2005

(54) VOLTAGE CONTROLLED OSCILLATOR

(75) Inventors: Eric P. Mitchell, Lake Oswego, OR (US); Mark R. Gehring, Portland, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 114 days.

(21) Appl. No.: 10/327,354

(22) Filed: Dec. 20, 2002

(51) Int. Cl.$^7$ .......................... H03L 7/08; H03L 7/087
(52) U.S. Cl. ..................... 331/11; 331/16; 331/44
(58) Field of Search .................... 331/1 A, 10, 11, 331/16, 18, 25, 44, 177 R, 179

(56) References Cited

U.S. PATENT DOCUMENTS

| | | | |
|---|---|---|---|
| 5,581,216 A | 12/1996 | Ruetz | |
| 5,640,523 A | 6/1997 | Williams | 375/360 |
| 5,648,744 A | 7/1997 | Prakash et al. | 331/11 |
| 5,745,011 A | 4/1998 | Scott | 331/44 |
| 5,748,048 A | 5/1998 | Moyal | 331/34 |
| 5,896,068 A | 4/1999 | Moyal | 331/34 |
| 5,926,041 A | 7/1999 | Duffy et al. | 324/12 |
| 6,026,134 A | 2/2000 | Duffy et al. | 375/376 |
| 6,337,604 B1 | 1/2002 | Clarke | 331/116 R |
| 6,404,294 B1 | 6/2002 | Sha et al. | 331/57 |
| 6,434,187 B1 | 8/2002 | Beard et al. | 375/219 |
| 6,658,748 B1 | 12/2003 | Leipold et al. | 33/179 |
| 6,686,804 B1 | 2/2004 | Adams et al. | 331/17 |
| 6,710,669 B2 | 3/2004 | Hasegawa et al. | 331/177 V |
| 6,731,209 B2 | 5/2004 | Wadlow et al. | 340/562 |
| 6,744,323 B1 | 6/2004 | Moyal et al. | 331/1 A |
| 6,744,324 B1 * | 6/2004 | Adams et al. | 331/17 |
| 6,747,522 B2 | 6/2004 | Pietruszynski et al. | |
| 6,791,421 B2 | 9/2004 | Oita | 331/14 |
| 6,798,296 B2 | 9/2004 | Lin et al. | 331/1 A |
| 6,803,830 B2 | 10/2004 | Scheffler | 331/36 C |

* cited by examiner

*Primary Examiner*—David Mis
(74) *Attorney, Agent, or Firm*—Wagner, Murabito & Hao, LLP

(57) ABSTRACT

Embodiments of the present invention provide a method of centering an operating band of a voltage controlled oscillator around a desired operating frequency. In one embodiment, an adjustable feedback divider provides for driving an output signal to the top and bottom of the operating band. An adjustable period divider and counter provide a plurality of count values for use in determining a mid-point of the operating band. A capacitance bank provides for selectively adjusting a capacitance of the voltage controlled oscillator, thereby adjusting the operating band.

20 Claims, 7 Drawing Sheets

VOLTAGE CONTROLLED OSCILLATOR

FIELD OF THE INVENTION

Embodiments of the present invention relate to voltage control oscillators (VCO) circuits, and more particularly to centering the operating band of a VCO circuit about a desired frequency.

BACKGROUND OF THE INVENTION

Voltage controlled oscillators (VCOs) are commonly employed in a variety of applications, including communication and timing circuitry. In particular, voltage controlled oscillators are commonly used in phase locked loop control systems. Functionally, a voltage controlled oscillator may be viewed as a circuit that seeks to transform an input control voltage signal to an output signal having a desired frequency.

Referring to FIG. 1, a clock diagram of a phase lock loop voltage controlled oscillator (PLL VCO) 100 in accordance with the conventional art is shown. As depicted in FIG. 1, the PLL VCO 100 comprises a reference clock 110, a phase/frequency detector 115, a charge pump 120, a voltage controlled oscillator (VCO) 125, and a feedback divider 130.

The phase-frequency detector 115 is responsive to a reference clock 150 and a feedback clock 155. The phase-frequency detector 115 may provide one or more out-of-lock indicator signals corresponding to whether and to what extent the feedback clock 155 is out-of-lock with the reference clock 150. In one implementation, the out-of-lock indicator signals may be up and down signals 160, 165. The charge pump 120 is responsive to the out-of-lock indicator signals, and provides for generating a control signal 170 whose voltage potential corresponds to a phase error between the feedback clock 155 and the reference clock 150. The VCO 125 is responsive to the control signal 170, and provides for generating an output signal 175 having a desired frequency (e.g., 2.44 GHz).

The feedback divider 130 reduces the frequency of the output signal 175. The divide value (e.g., N=2400) is selected based upon the frequency of the reference clock 150 and the frequency of the desired output signal 175. When the output signal 175 is operating at the desired frequency, the feedback divider 130 reduces the frequency of the output signal 175 such that the frequency of the feedback clock 155 is equal to the frequency of the reference clock 150 (e.g., 1 MHz), and hence the PLL VCO 100 operates in a phase lock condition. If the frequency of the output signal 175 is higher than desired, the frequency of the feedback clock signal 155 will be greater than the frequency of the reference clock 150. As a result the phase/frequency detector 115 will output a down signal 165 causing the control signal 170 from the charge pump 120 to be decreased. Thus, the oscillating frequency of the VCO 125 will be reduced, until the phase lock condition is achieved again. If the frequency of the output signal 175 is lower than desired, the frequency of the feedback clock signal 155 will be less than the frequency of the reference clock 150. As a result the phase/frequency detector 160 will output an up signal 160, causing the control signal 170 from the charge pump 120 to be increased. Thus, the oscillating frequency of the VCO 125 will be increased, until the phase lock condition is achieved again.

The VCO 125 operates within a finite band of frequencies (e.g., 2.1 to 2.9 GHz). Ideally, this band would be centered around a desired frequency. However, process variations limit the accuracy that can be achieved in centering the frequency band around the desired frequency. The operating temperature also causes variations of the operating band of the voltage controlled oscillator circuit.

One solution, according to the conventional art, is to provide additional circuitry to expand the frequency band to ensure that all frequencies are available to compensate for process and temperature variations. This method is disadvantageous in that it adds additional cost and uses additional valuable real estate. The additional tuning range is also disadvantageous in that it causes the voltage controlled oscillator 125 to be more sensitive to noise and interference.

Another solution, according to the convention art, is to manually adjust the frequency band to be centered about the desired operating frequency. However, manual adjustments are an added cost, and require the customer or user to correctly perform the operation. This can lead to performance degradation and can be tedious and/or error prone.

SUMMARY OF THE INVENTION

Embodiments of the present invention provide a method of centering the operating band around a desired operating frequency. Embodiments of the present invention provide a successive approximation logic process to determine how much oscillator capacitance is needed to substantially center an operating band of a voltage controlled oscillator around a desired operating frequency.

Embodiments of the present invention also provide a method for determining where in a frequency band a voltage controlled oscillator operates by default. A mechanism for centering the operating band around a desired frequency, by adjusting a capacitance value of the voltage controlled oscillator, is also provided.

Embodiments of the present invention also provide a voltage controlled oscillator circuit wherein the operating band is readily centered about a desired operating frequency. Embodiments of the voltage controlled oscillator comprise an adjustable feedback divider for driving the output of the voltage controlled oscillator to the top and bottom of its operating band in response to a user input. Embodiments of the voltage controlled oscillator also comprise an adjustable period divider and counter for providing a mid-point frequency of the operating band as an output to a user. Embodiments of the voltage controlled oscillator also comprise a capacitor bank for adjusting the operating band in response to another user input.

Embodiment of the present invention also provide a voltage controlled oscillator circuit wherein the operating band is readily adjusted. Embodiment of the voltage controlled oscillator comprise a capacitor bank having a plurality of binary weighted capacitors which can be selectively coupled to and un-coupled from the voltage controlled oscillator.

Embodiments of the present invention are advantageous in that a voltage controlled oscillator having a minimum tuning range can be utilized. A minimal tuning range is advantageous in that the voltage controlled oscillator is less sensitive to noise and interference. Embodiments of the present invention are also advantageous in that process variations in the voltage controlled oscillator may be readily compensated for. Embodiments of the present invention are also advantageous in that variations in the operating temperature of the voltage controlled oscillator circuit may be readily compensated for. Embodiment of the present invention are also advantageous in that minimal manual tuning is required.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
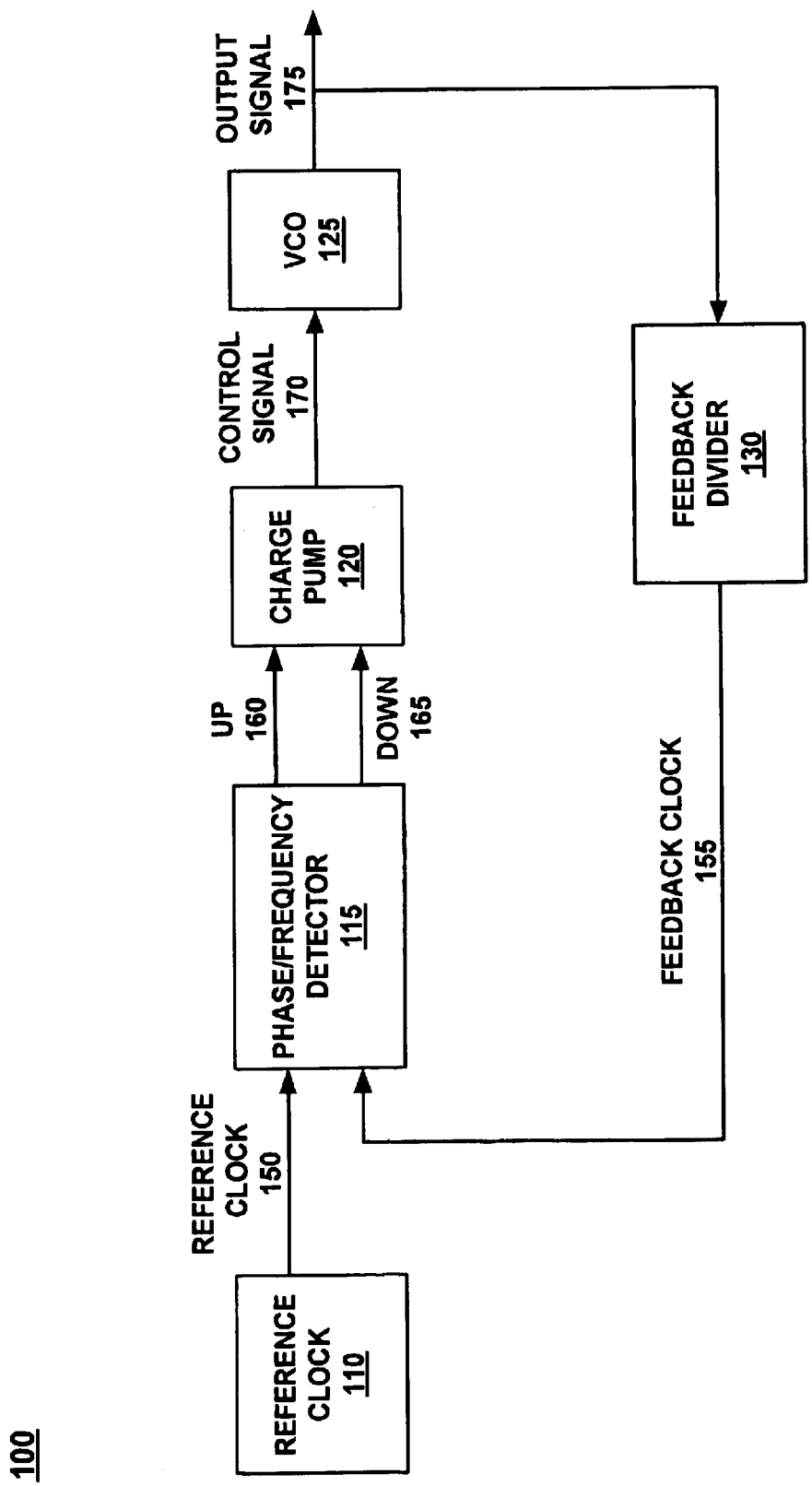
FIG. 1 shows a block diagram of a phase lock loop voltage controlled oscillator in accordance with the conventional art.
Figure 2:
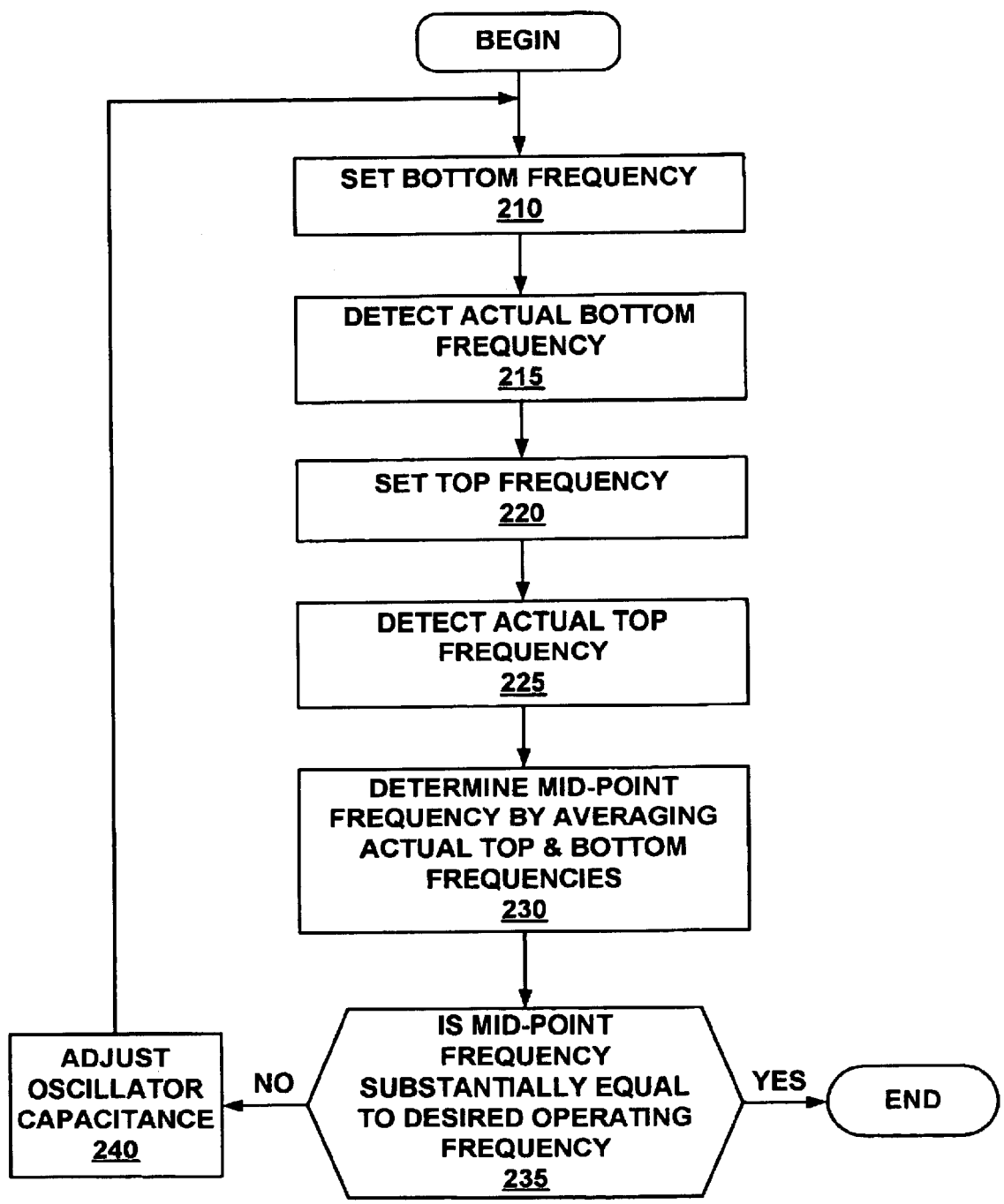
FIG. 2 shows a flow diagram of a method for centering an operation band about a desired operating frequency of a voltage controlled oscillator in accordance with one embodiment of the present invention.

Referring now to FIG. 2, a flow diagram of a method for centering an operating band about a desired operating frequency of a voltage controlled oscillator (VC0) in accordance with one embodiment of the present invention is shown. As depicted in FIG. 2, the process begins by setting a bottom frequency (e.g., a lower most operating frequency) at step 210. At step 215, the actual bottom frequency generated is detected. The top frequency (e.g., an upper most operating frequency within the operating band) is then set at step 220. At step 225, the actual top frequency generated is detected. The actual bottom frequency and actual top frequency are averaged together to determine a mid-point frequency of the operating band, at step 230. The mid-point frequency is then compared to a desired operating frequency, at step 235. At step 240, a capacitance of the VCO is adjusted according to the comparison between the mid-point frequency and the desired operating frequency. Adjusting the capacitance of the VCO results in the actual bottom and top frequencies being changed. Steps 210–240, are iteratively performed until the mid-point frequency substantially equals the desired operating frequency.

Hence, a successive approximation and adjustment of the mid-point frequency is performed. In one implementation a capacitance bank, comprising a plurality of capacitors arranged in parallel, may be utilized to adjust the capacitance of the VCO. Each capacitor may be selectively switched in or out of the VCO circuit. The process may begin with approximately half the capacitance value switched into the VCO circuit. Based upon the successive approximation of the mid-point frequency of the operating band, one or more capacitors are the successively switched into or out of the VCO circuit until the operating band is centered about a desired operating frequency.

Figure 3A:
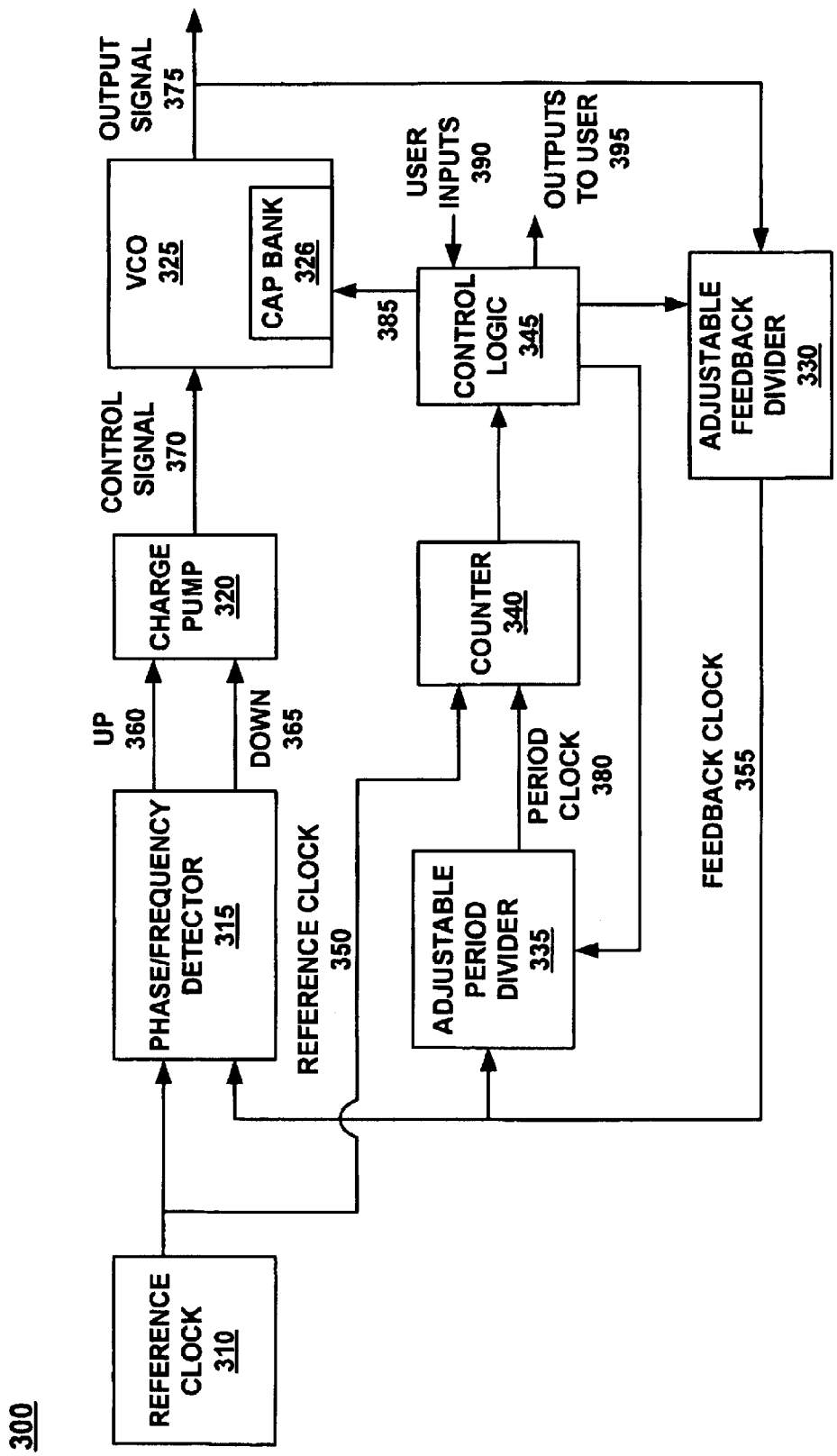
FIG. 3A shows a block diagram of a phase lock loop voltage controlled oscillator in accordance with one embodiment of the present invention.

Referring now to FIG. 3A, a block diagram of a phase lock loop voltage controlled oscillator (PLL VCO) 300 in accordance with one embodiment of the present invention is shown. As depicted in FIG. 3A, the PLL VCO 300 comprises a reference clock 310, a phase/frequency detector 315, a charge pump 320, a voltage controlled oscillator (VCO) 325, an adjustable feedback divider 330, an adjustable period divider 335, a counter 340, and control logic 345.

The phase-frequency detector 315 is responsive to a reference clock 350 and a feedback clock 355. The phase-frequency detector 315 may provide one or more out-of-lock indicative signals corresponding to whether and to what extent the feedback clock 355 is out-of-lock with the reference clock 350. In one implementation, the out-of-lock indicative signals may be up and down signals 360 365. The charge pump 320 is responsive to the out-of-lock indicative signals, and provides for generating a control signal 370 whose voltage potential corresponds to a phase error between the feedback clock 355 and the reference clock 350. The VCO 325 is responsive to the control signal 370, and provides for generating an output signal 375. The output signal 375 of the VCO 325 has a desired operating frequency (e.g., 2.44 GHz) within the operating band (e.g. 2.2 GHz to 3.2 GHz) of the VCO 325.

The control logic 345 receives a first and a second input 390, e.g., from a user, specifying a feedback divide value N and a period divide value P, respectively. The control logic selectively controls the divide values N and P of the adjustable feedback divider 330 and the adjustable period divider 335 respectively in response to said fist and second user inputs 390.

The adjustable feedback divider 330 reduces the frequency of the output signal (e.g., 2.44 GHz) 375, according to the feedback divide value N. As a result, the adjustable feedback divider provides a feedback clock 355 to the phase/frequency detector 315 and the adjustable period divider 335. The adjustable period divider 335, reduces the feedback clock 355, according to the period divide value P. As a result, the adjustable period divider provides a period clock 380. The counter 340 counts the number of reference clock 350 cycles that occur during a cycle of the period clock 380 and outputs the results to the control logic 345. The control logic 345 provides the count value as an output to the user.

By specifying applicable feedback divide values N and applicable period divide values P, a user can drive the VCO 325 to the top and bottom of its operating band. More specifically, the feedback clock 355 is set to a high frequency value, by dividing the frequency of the output signal 375 by a small feedback divide value N; (e.g., N=1600). The value of N is selected such that the VCO 325 operates at its lowest possible operating point within the operating band (e.g. the PLL VCO 300 will not be successful in locking onto a frequency that will resolve the difference between feedback clock 355 and the reference clock 350). Given that the VCO 325 is operating at its lowest possible operating point within the operating band, the feedback clock 355 runs at a frequency greater than the reference clock 350. As a result the phase/frequency detector 315 outputs an out-of-lock signal 360, 365 such that the VCO 325 is driven to provide an output signal 375 having a slowest possible frequency.

The high feedback clock 355 is also divided by a large period divide value P (e.g., P=100), and the resulting period clock 380 is used as a period boundary. Edges of the reference clock 350 are counted during one period of the period clock 380, and the result is output to the user 395 by the control logic 345 as a high count value.

Next, the feedback clock 330 is set to a low frequency value, by dividing the frequency of the output signal 375 by a large feedback divide value N (e.g., N=3200). The value of N is selected such that the VCO 325 operates at its highest possible operating point within the operating band (e.g. the PLL VCO 300 will not be successful in locking onto a frequency that will resolve the difference between feedback clock 355 and the reference clock 350). Given that the VCO 325 is operating at its highest possible operating point within the operating band, the feedback clock 355 runs at a frequency less than the reference clock 350. As a result the phase/frequency detector 315 outputs an out-of-lock signal 360, 365 such that the VCO 325 is driven to provide an output signal 375 having a fastest possible frequency.

The low feedback clock 355 is also divided by a small period divide value P (e.g. P=50), and the resulting clock is used as a period boundary. Edges of the reference clock 350 are counted during one period of the period clock 380, and the result is output to the user 395 by the control logic 345 as a low count value.

In one implementation, the user can average the low and high count values and compare it to an expected count value. If the measured average value is higher than the expected count value, the mid-point of the operating band of the VCO 325 is too high. Hence, there is too much capacitance to charge. If the measured average value is lower than the expected count value, the mid-point of the operating band of the VCO 325 is too low. Hence there is not enough capacitance to charge.

In another implementation, the low and high count values can be summed, instead of averaged. In such an implementation, the expected count value is adjusted accordingly.

Figure 3B:
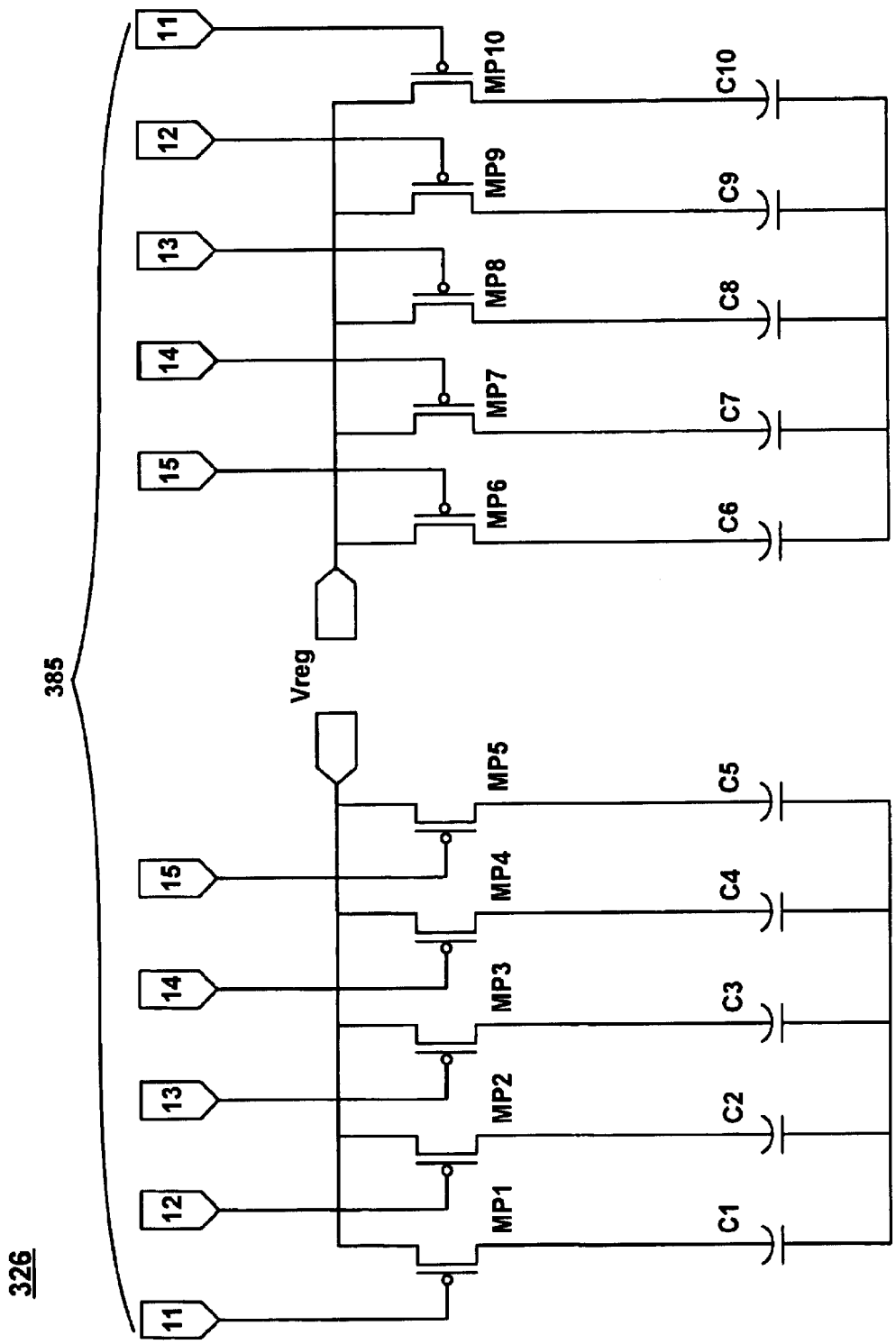
FIG. 3B shows a capacitor bank of a voltage controlled oscillator in accordance with an exemplary embodiment of the present invention.

Referring now to FIG. 3B, a capacitor bank 326 of the VCO 325 in accordance with an exemplary embodiment of the present invention is shown. As depicted in FIG. 3B, the capacitor bank comprises a plurality of parallel capacitors (C1, C2, C3, C4, C5, and C6, C7, C8, C9, C10) that can be selectively switched in and out by a plurality of switching elements (MP1, MP2, MP3, MP4, MP5, and MP6, MP7, MP8, MP9, MP10). The capacitor bank is coupled between a pair of nodes (e.g., Vreg), which effect the operating band of the voltage controlled oscillator. The exemplary capacitor bank is illustrative of a differential VCO implementation. A single-ended VCO implementation only requires a left or right half of the exemplary capacitor bank.

Control signals (e.g., I1, I2, I3, I4, I5) 385 received from the control logic 345 are utilized to control the switching state of the switching elements (MP1, MP2, MP3, MP4, MP5, and MP6, MP7, MP8, MP9, MP10). When given switching elements (e.g., MP5, MP6)) are in an open state in response to a corresponding control signal (e.g., I5) the corresponding capacitors (e.g., C5, C6) are removed from the VCO circuit. When given switching elements (e.g., MP5, MP6) are in a closed state in response to a corresponding control signal (e.g., I5) the corresponding capacitors (e.g., C5, C6) are connected to the VCO circuit.

The available capacitance is divided into a combination of discrete capacitors. In one implementation, the capacitance values are all equal. In another implementation, a bank of binary weighted capacitors 385 is provided (e.g., C2=2×C1, C3=4×C1, C4=8×C1, C5=16×C1, and the like). The initial condition of the capacitance bank 326 may be such that the most significant capacitances (e.g., C5, C6) are switched in and the less significant capacitances (e.g., C1, C2, C3, C4, C7, C8, C9, C10) are switched out.

If there is too much capacitance to charge, the current significant capacitances (e.g., C5, C10) are switched out, and the next most significant capacitors are switched in (e.g., C4, C7) by the switching signals (e.g., I1, I2, I3, I4) 385 from the control logic 345. If there is not enough capacitance, the current significant capacitances (e.g., C5, C10) are left switched in, and the next most significant capacitors (e.g., C4, C7) are also switched in by the switching signals (e.g., I1, I2, I3, I4) 385 from the control logic 345. The process of calculating the low and high operating points of the operating band is repeated, for each discrete capacitor in the capacitor bank 326. Hence, by successive approximation of the mid-point of the operating band of the voltage controlled oscillator and successively switching in or out capacitors from most significant to least significant capacitors, a maximum number of passes equal to the number of capacitors in the capacitance bank 326 (e.g., five) are required to center the operating band about a desired operating frequency.

In addition to centering, the operating band of the VCO circuit about a desired frequency, the capacitance bank may also be utilized to compensate for process variations and operating temperature variations. Process variation occurring during fabrication of the VCO circuit result in shifting of the operating band from one VCO circuit to another. Thus, the capacitance bank, which provides for selectively adjusting the capacitance of each VCO circuit, can be utilized to compensate for process variations in the VCO circuit. Similarly, variations in the operating temperature between one VCO circuit and another, result in a shift of the operating band of one VCO circuit with respect to another. Thus, the capacitance bank can also be utilized to compensate for operating temperature variations.

In an optional feature (not shown), once the programming state for each of the capacitors (C1, C2, C3, C4, C5, C6, C7, C8, C9, C10) is determined, the state of the capacitance bank 326 may be permanently set by any well-known method, such as selectively opening one or more fusible links.

Figure 4A:
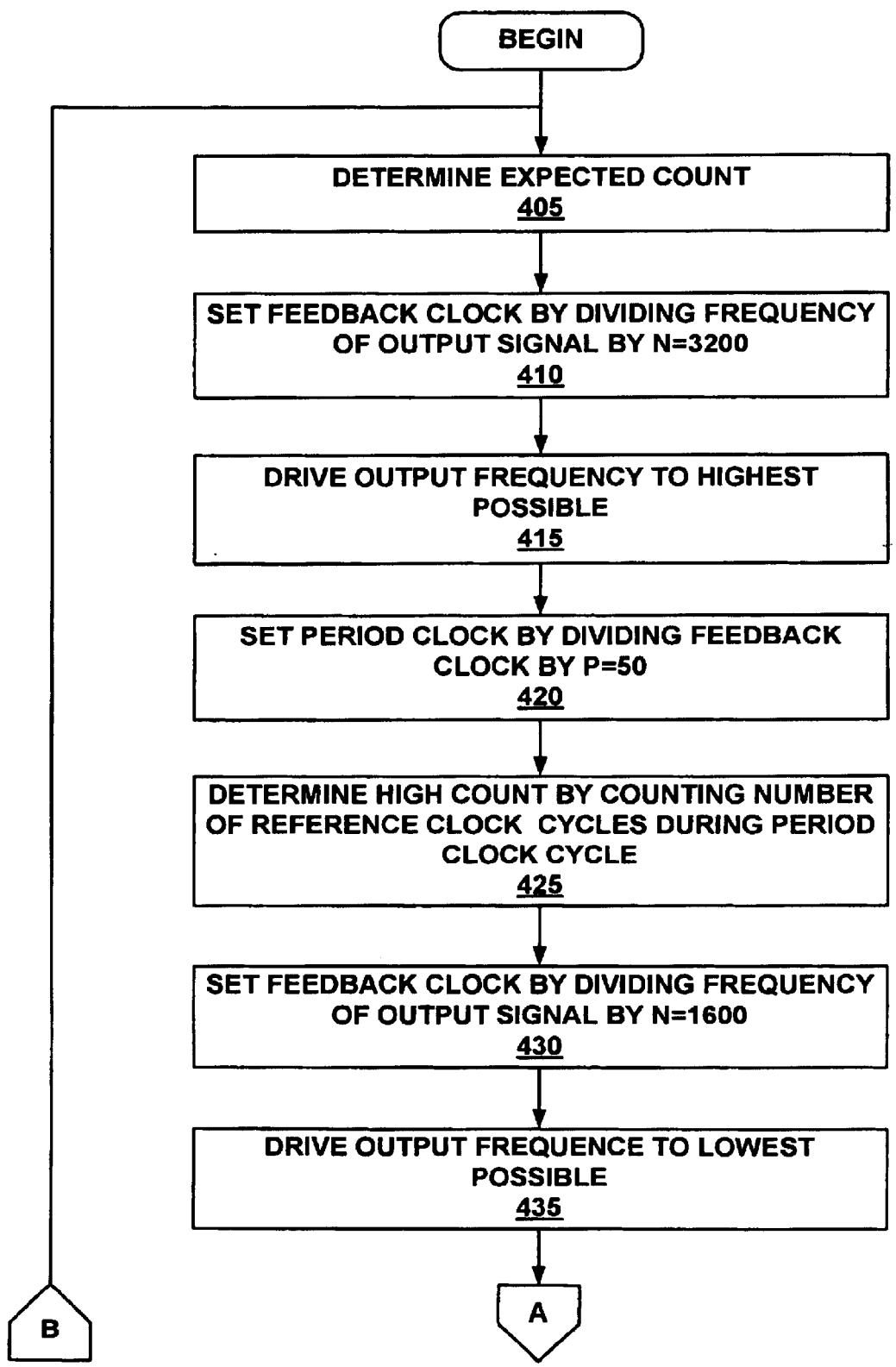
FIGS. 4A–4B show a flow diagram of a method of centering an operating band about a desired operating frequency of a phase lock loop voltage controlled oscillator in accordance with one embodiment of the present invention.
Figure 4B:
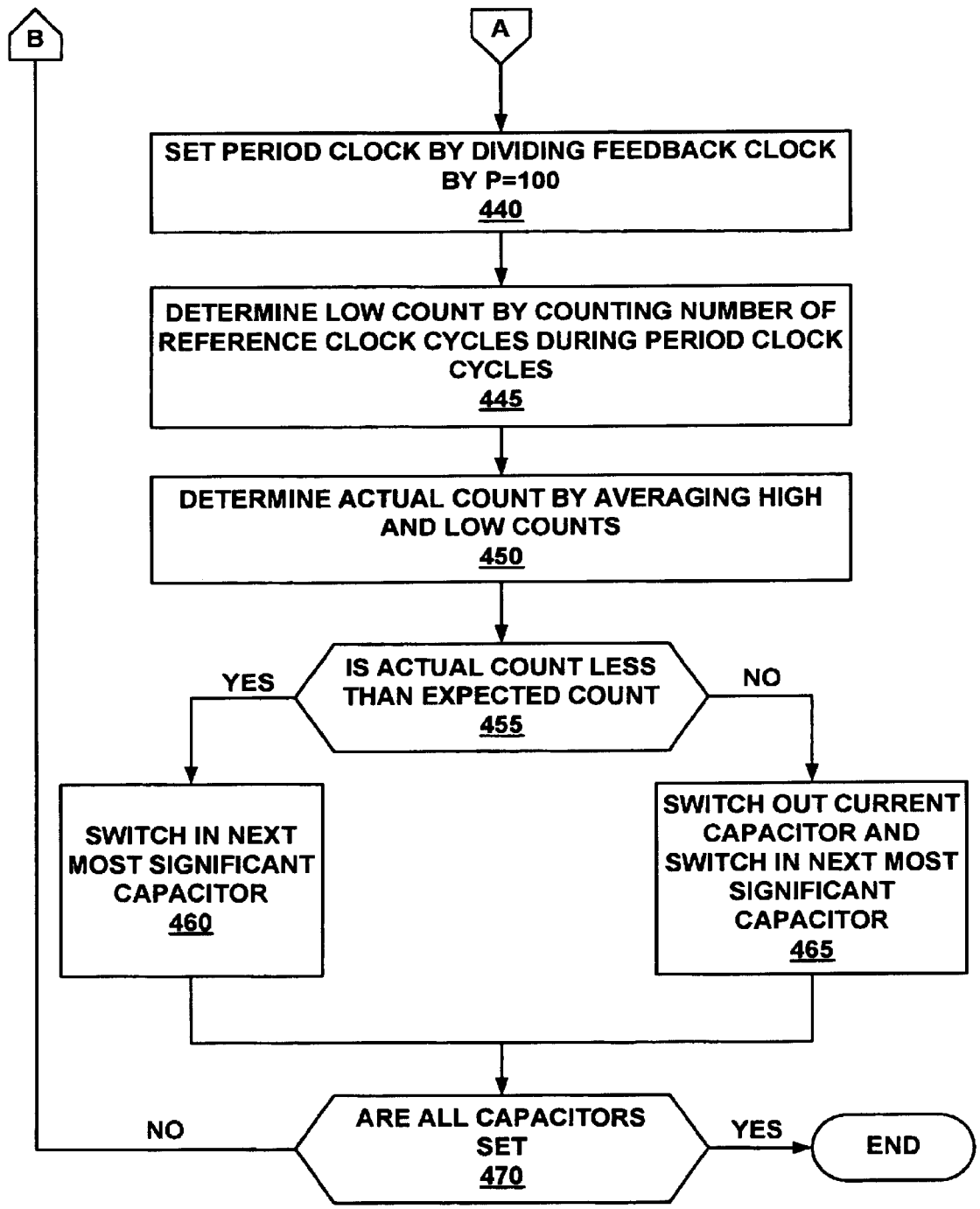

Referring now to FIGS. 4A–4B, a flow diagram of a method of centering an operating band (e.g., 2.2 GHz to 3.2 GHz) about a desired operating frequency (e.g., 2.44 GHz) of a phase lock loop voltage controlled oscillator (PLL VCO) in accordance with one embodiment of the present invention is shown. As depicted in FIGS. 4A–4B, the process begins by determining an expected count value, at step 405. In one implementation, a desired center frequency (e.g., 2.44 GHz) is divided by a feedback divide value N (e.g., 3200 or 1600) to obtain an expected feedback clock frequency (e.g., 762.5 KHz at high side N=3200). The expected feedback clock is then divided by a period divide value P (e.g., 50 if N=3200, or 100 if N=1600) to obtain an expected period clock (e.g., 15,35 KHz for P=50 and N=3200). The expected count value (e.g., 64.8) is then obtained by dividing the frequency of a reference clock (e.g., 1 MHz) by the expected period clock.

At step 410, a feedback clock of the PLL VCO is set by dividing the frequency of an output signal by a high feedback divide value (e.g., N=3200). As a result, step 415, the frequency of the output signal of the voltage controlled oscillator is driven to the highest possible point in the operating band (e.g., 3.2 GHz). A period clock is set by dividing the feedback clock by a low period divide value (e.g., P=50), at step 420. At step 425, a high count value is determined by counting the number of reference clock cycles during a cycle of the period clock (e.g., 50 counts).

At step 430, the feedback clock is then set by dividing the frequency of the output signal by a low feedback divide value (e.g., N=1600). As a result, step 435, the frequency of the output signal of the voltage controlled oscillator is driven to the lowest possible point in the operating band (e.g., 2.2 GHz). The period clock is then set by dividing the feedback clock by a high period divide value (e.g., P=100), at step 440. At step 445, a low count value is determined by counting the number of reference clock cycles during a cycle of the period clock (e.g., 74.8 counts).

At step 450, an actual count is determined by averaging the high count and low count values. Next, it is determined whether or not the actual count (e.g., 62.4) is less than the expected count (64.8), at step 455. If the actual count value is less than the expected count, then there is not enough capacitance in the VCO circuit. If the average count value is greater than the expected count, then there is an excess of capacitance in the VCO circuit.

If the average count is less than the expected count, a next most significant capacitor, in a binary weighted capacitor bank, of the VCO, is switched in, at step 460. If the average count is not less than the expected count, a current significant capacitor is switched out and the next most significant capacitor is switched in, at step 465. At step 470, the above-described process is repeated for each capacitor in the binary weighted capacitance bank, starting with the most significant capacitor and ending with the least significant capacitor.

Figure 5:
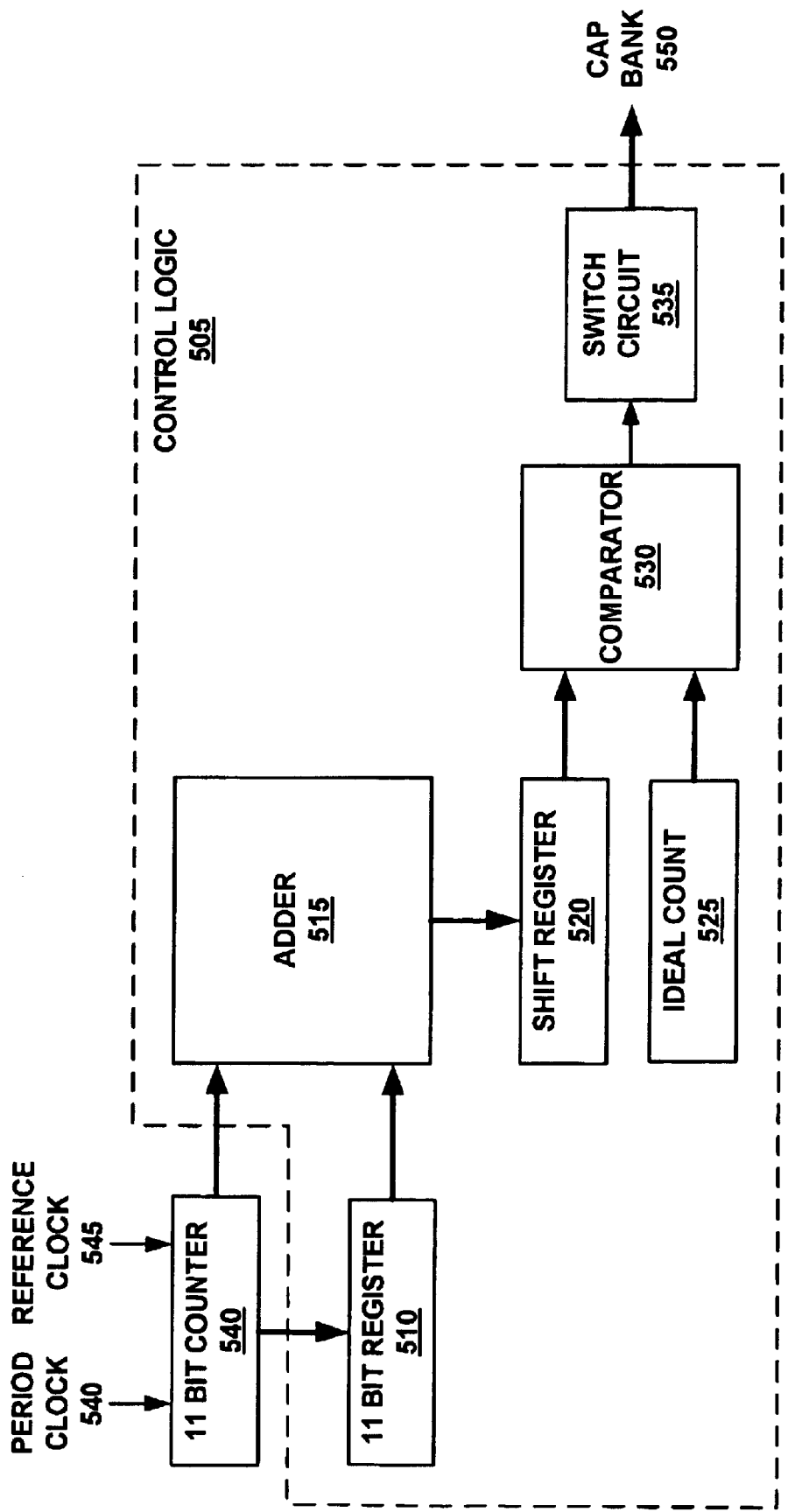
FIG. 5 shows a block diagram of a control logic of a PLL VCO, in accordance with one embodiment of the present invention.

Referring now to FIG. 5, a block diagram of a control logic 505 of a PLL VCO, in accordance with one embodiment of the present invention is shown. As depicted in FIG. 5, the control logic 505 comprises a register 510, an added 515, a shift register 520, an ideal count register 525, a comparator 530, and a switch circuit 535.

A counter 540 is coupled to the register 510 and the adder 515. The register 510 is also coupled to the adder 515. The adder 515 is coupled to the shift register 520. The shift register 520 and the ideal count register 525 are coupled to the comparator 530. The comparator is coupled to the switch circuit 535.

The counter receives a start signal and an increment signal. The start signal comprises a period clock 540. The increment signal comprises a reference clock 545. Upon occurrence of a first start signal 540, the counter 540 increments in response to each occurrence of the increment signal 545.

Upon the second occurrence of the start signal 540, the value contained in the counter 540 is shifted into the register 510. The counter 540 is also reset, and upon the occurrence of a third start signal 540, the counter is incremented again.

Upon the forth occurrence of the start signal 540, the value contained the shift register 520. The sum is then right-shifted by one bit. As a result, the shift register 520 contains the average of the values contained in the counter 540 and the register 510.

The comparator 530 then compared average to an ideal count contained in the ideal counter 525. Based upon whether the average count or ideal count value is larger, more or less capacitance, in a capacitor bank 550, is selectively added by the switch circuit 535. The control logic 505 iteratively determines successive average count values and adjusts the capacitor bank 505 accordingly.

In one implementation, the control logic performs the successive approximation routine of the present embodiment in response to a control signal received on an external pin. In another implementation, the control logic performs the successive approximation routine of the present embodiment in response to an internally generated control signal. In another embodiment, the control logic also performs initialization of the various registers, counters, dividers, switches, and the like.

Embodiments of the present invention are advantageous in that a minimal operating band of the PLL VCO is required. Embodiments of the present invention are advantageous in that the PLL VCO is less susceptible to noise and interference. Embodiments of the present invention are advantageous in that changes in temperature can be readily compensated for. Embodiments of the present invention are advantageous in that component and process variations can be readily compensated for.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of centering an operating band of a voltage controlled oscillator about a desired operating frequency comprising:

a) determining a mid-point frequency of said operating band;

b) comparing said mid-point frequency to said desired operating frequency; and c) adjusting a capacitance of said voltage controlled oscillator according to said comparison in said b).

2. The method according to claim 1, wherein said a) determining a mid-point frequency comprises:

detecting a bottom frequency of said operating band;

detecting a top frequency of said operating band; and averaging said bottom frequency and said top frequency.

3. The method according to claim 2, wherein said detecting a bottom frequency of said operating band comprises selecting a low feedback divide value to drive said voltage controlled oscillator to said bottom frequency; and wherein said detecting a top frequency of said operating band comprises selecting a high feedback divide value to drive said voltage controlled oscillator to said top frequency.

4. The method according to claim 1, wherein said c) adjusting said capacitance comprises selectively coupling a plurality of capacitors.

5. The method according to claim 1, further comprising:
d) iteratively repeating said a), b) and c) until said mid-point frequency substantially equals said desired operating frequency.

6. A voltage controlled oscillator comprising:
an adjustable feedback divider coupled to an output of said voltage controlled oscillator and a first output of a control logic;
an adjustable period divider coupled to an output of said adjustable feedback divider and a second output of said control logic;
a counter coupled to an output of said adjustable period divider and an output of a reference clock generator; and
wherein said control logic is coupled to an output of said counter.

7. The voltage controlled oscillator according to claim 6, wherein said adjustable feedback divider and said control logic provide for driving said voltage controlled oscillator to a top of an operating band and a bottom of said operating band in response to a first user input.

8. The voltage controlled oscillator according to claim 7, wherein said adjustable period divider, counter, and control logic provide for determining an actual count value for output to a user.

9. The voltage controlled oscillator according to claim 8, further comprising a capacitance bank, wherein said capacitance bank is selectively adjusted in response to a second user input received by said control logic.

10. The voltage controlled oscillator according to claim 9, wherein an operating band of an output signal provided by said voltage controlled oscillator is readily centered about a desired operating frequency.

11. The voltage controlled oscillator according to claim 10, wherein process variations in said voltage controlled oscillator resulting in shifting of said operating band are readily compensated for by selectively adjusting said capacitance bank.

12. The voltage controlled oscillator according to claim 11, wherein shifting of said operating band of said voltage controlled oscillator due to variations in the operating temperature are readily compensated for by selectively adjusting said capacitance bank.

13. The voltage controlled oscillator according to claim 7, wherein said voltage controlled oscillator comprises a phase lock loop voltage controlled oscillator.

14. A method of centering an operating band of a phase lock loop voltage controlled oscillator about a desired operating frequency comprising:
a) determining an expected count;
b) determining an actual count;
c) increasing a capacitance of said voltage controlled oscillator when said actual count is less than said expected count; and
d) decreasing a capacitance of said voltage controlled oscillator when said actual count is greater than said expected count.

15. The method according to claim 14, wherein said expected count is based upon a desired operating frequency.

16. The method according to claim 14, wherein said actual count is based upon the average of an upper operating frequency and a lower operating frequency of said operating band.

17. The method according to claim 16, further comprising:
determining said upper operating frequency by dividing by a large feedback value and a small clock period value and counting the number of reference clock cycles in a clock period cycle; and
determining said lower operating frequency by dividing by a small feedback value and a large clock period value and counting the number of reference clock cycles in a clock period cycle.

18. The method according to claim 14, wherein said capacitance comprises a capacitance bank.

19. The method according to claim 18, wherein said capacitance bank comprises a plurality of selectively couplable binary weighted capacitors.

20. The method according to claim 19, wherein said c) increasing said capacitance comprises coupling a next most significant binary weighted capacitor to said voltage controlled oscillator, and wherein said d) decreasing said capacitance comprises un-coupling a current significant binary weighted capacitor and coupling said next most significant binary weighted capacitor.

* * * * *